(12) United States Patent
Toffolon et al.

(10) Patent No.: US 7,701,277 B2
(45) Date of Patent: Apr. 20, 2010

(54) VARIABLE-IMPEDANCE GATED DECOUPLING CELL

(75) Inventors: Dino A. Toffolon, Stoney Creek (CA); Chris Dietrich, Mississauga (CA)

(73) Assignee: Synopsys, Inc., Mountain View, CA (US)

( * ) Notice: Subject to any disclaimer, the term of this patent is extended or adjusted under 35 U.S.C. 154(b) by 110 days.

(21) Appl. No.: 11/955,125

(22) Filed: Dec. 12, 2007

(65) Prior Publication Data

US 2009/0153239 A1     Jun. 18, 2009

(51) Int. Cl.
*H03K 5/08* (2006.01)
(52) U.S. Cl. .................................. 327/310; 327/551
(58) Field of Classification Search ................. 327/530, 327/551–559, 310, 311, 313
See application file for complete search history.

(56) References Cited

U.S. PATENT DOCUMENTS 5,789,964 A * 8/1998 Voldman .................... 327/380
5,946,177 A * 8/1999 Miller et al. ................... 361/56
6,844,771 B1   1/2005 Chen
2005/0062523 A1* 3/2005 Wang et al. .................. 327/554
2007/0195483 A1   8/2007 Asano

FOREIGN PATENT DOCUMENTS

EP          0975093 A1     1/2000

* cited by examiner

*Primary Examiner*—Quan Tra
(74) *Attorney, Agent, or Firm*—Park, Vaughan & Fleming LLP; Anthony P. Jones

(57) ABSTRACT

Embodiments of the present invention provide a system that controls noise in a power system that includes a power rail and a ground rail. The system includes a MOS transistor coupled in series with a decoupling capacitor between the power rail and the ground rail and an inductive packaging connection coupled to the power rail in parallel with the MOS transistor and the decoupling capacitor. The combination of MOS transistor, decoupling capacitor, and inductive packaging connection form a resonant circuit. During operation, the system determines if there is noise in a $V_{dd}$ signal on the power rail. Based on the noise present in the $V_{dd}$ signal, the system adjusts the impedance of the MOS transistor to reduce the noise in a frequency range near a frequency of interest ($\omega_{interest}$) of the resonant circuit without causing an unnecessary increase in switching noise at other frequencies.

25 Claims, 5 Drawing Sheets

VARIABLE-IMPEDANCE GATED DECOUPLING CELL

BACKGROUND

1. Field of the Invention

Embodiments of the present invention relate to circuits. More specifically, embodiments of the present invention relate to the design of a variable-impedance gated decoupling cell.

2. Related Art

Recent developments in integrated circuit technologies have enabled designers to create complex integrated circuits on semiconductor chips which include both digital and analog circuitry. A "system-on-a-chip" (SOC) is one such integrated circuit, which includes different types of circuits that enable the SOC to perform a wide variety of functions. For example, SOCs can include controllers, processors, graphics and audio processors, transceivers, networking devices, communication circuits, memories, and other types of circuits. These functional capabilities enable SOCs to be used in devices such as cell phones, personal digital assistants, embedded systems, portable computers, media players, desktop computers, household electronics and appliances, device controllers, and many other devices.

Generally, SOCs (and virtually all other types of semiconductor chips) include power rails (commonly called $V_{dd}$) and ground rails (commonly called $V_{ss}$), which are separately coupled from the SOC to a printed circuit board (PCB) power plane through inductive packaging connections to provide electrical power (and ground) for the SOC. On-chip decoupling capacitors are often coupled between the power and ground rails to filter out unwanted high frequency noise in the $V_{dd}$ signal. (Note that we call the signal on the power rail the "$V_{dd}$ signal.") Depending on the application, the decoupling capacitors can be a metal-oxide-silicon (MOS) decoupling capacitors, metal-insulator-metal (MIM) capacitors, varactors, or other forms of decoupling capacitors. For example, FIG. 1 presents a circuit diagram of a typical MOS decoupling capacitor 100.

Unfortunately, the parallel combination of the inductive packaging connection to $V_{dd}$ and on-chip decoupling capacitors creates a resonant LC circuit whose impedance can be high in a range of frequencies near a resonance frequency ($\omega_{res}$). Consequently, noise in the range of frequencies near $\omega_{res}$ is not filtered from the $V_{dd}$ signal. Depending on the application, this range of frequencies can include frequencies from a within a few Hz of $\omega_{res}$ to within kHz, MHz, or GHz of $\omega_{res}$.

To remedy this problem, some designers have proposed placing dissipative elements, such as fixed-value resistors, in series with the decoupling capacitors. FIG. 2 presents a circuit diagram of resistor 202 in series with MOS capacitor 200. Unfortunately, while eliminating noise near $\omega_{res}$, this technique can reduce the efficiency of the decoupling capacitors for controlling noise in the $V_{dd}$ signal in other frequency ranges. In a related development, some designers have proposed adding a MOS transistor in series with the decoupling capacitor to enable a system to disable the circuit path to the decoupling capacitor when the decoupling capacitor is not required. Unfortunately, the MOS transistors in these systems are either "ON" or "OFF," and in circumstances where the MOS transistors are ON, the system can still experience excessive noise near $\omega_{res}$.

Hence, what is needed is a decoupling mechanism which does not suffer from the above-described problems.

SUMMARY

Embodiments of the present invention provide a system for controlling noise in a power system that includes a power rail and a ground rail. The system includes: (1) a decoupling capacitor having a first lead which is coupled to the ground rail; (2) a MOS transistor coupled in series with the decoupling capacitor, wherein a source of the MOS transistor is coupled to the power rail and a drain of the MOS transistor is coupled to a second lead on the decoupling capacitor; and (3) an inductive packaging connection coupled to the power rail. The MOS transistor and the decoupling capacitor are configured to be in parallel with the inductive packaging connection, thereby forming a resonant circuit. In addition, the system includes a control circuit within an input coupled to the power rail and an output coupled to a gate of the MOS transistor. During operation, the control circuit determines a noise in the $V_{dd}$ signal. The control circuit is configured to adjust a voltage applied to the gate of the MOS transistor based on the noise in the $V_{dd}$ signal, thereby changing an impedance of the MOS transistor to reduce the noise in a frequency range near a frequency of interest ($\omega_{interest}$) of the resonant circuit without causing an unnecessary increase in switching noise at other frequencies. Note that the frequency of interest can be defined to be a frequency at which the circuit is likely to experience noise in the $V_{dd}$ signal. For example, the frequency of interest can be a resonance frequency of the resonant LC circuit ($\omega_{res}$) or a frequency near the operating frequency of the circuit ($\omega_{operation}$).

In some embodiments of the present invention, the control circuit comprises: (1) a noise-sensing mechanism configured to monitor the $V_{dd}$ signal and output at least one signal representing the noise in at least one frequency range of the $V_{dd}$ signal; and (2) a determination mechanism configured to receive the at least one signal from the noise-sensing mechanism and adjust the voltage applied to the gate of the MOS transistor.

In some embodiments of the present invention, the noise-sensing mechanism is configured to output a present representation of the noise in the $V_{dd}$ signal in a predetermined frequency range near $\omega_{interest}$ and a present amplitude of the noise in the $V_{dd}$ signal in at least one other frequency range of the $V_{dd}$ signal. In these embodiments, the determination mechanism is configured to determine a change in the impedance of the MOS transistor by comparing the present amplitude of the noise in the $V_{dd}$ signal in the predetermined frequency range near $\omega_{interest}$ to at least one previous amplitude of the noise in the $V_{dd}$ signal in the predetermined frequency range near $\omega_{interest}$ and by comparing the present amplitude of the noise in at least one other frequency range of the $V_{dd}$ signal to at least one previous amplitude of the noise in at least one other frequency range of the $V_{dd}$ signal.

In some embodiments of the present invention, the noise-sensing mechanism is configured to down-convert the total noise power in the $V_{dd}$ signal to a DC signal and output the DC signal. In these embodiments, the determination mechanism is configured to determine the noise in the $V_{dd}$ signal by comparing a present value of the DC signal to at least one previous value of the DC signal.

In some embodiments of the present invention, the noise-sensing mechanism is configured to detect a present peak in an amplitude of at least one frequency range of the $V_{dd}$ signal and output the present peak. In these embodiments, the determination mechanism is configured to determine the impedance of the MOS transistor by comparing the present peak to a previous peak in the amplitude of the at least one frequency range of the $V_{dd}$ signal.

In some embodiments, when outputting the present amplitude of the noise in the $V_{dd}$ signal in a given frequency range, the noise-sensing mechanism is configured to sample the noise in the $V_{dd}$ signal two or more times and compute a value for the present amplitude that represents the two or more samples of the noise in the $V_{dd}$ signal. For example, the noise-sensing mechanism can compute a cumulative value, an average value, or another value.

In some embodiments of the present invention, the control circuit is configured to increase the impedance of the MOS transistor to decrease the noise in the frequency range near $\omega_{interest}$ or decrease the impedance of the MOS transistor to decrease the switching noise at other frequencies.

In some embodiments of the present invention, the decoupling capacitor is a metal-oxide-silicon (MOS) capacitor, a metal-insulator-metal (MIM) capacitor, or a varactor.

In some embodiments of the present invention where the decoupling capacitor is a MOS transistor, the MOS transistor is NMOS and the decoupling capacitor is PMOS. In other embodiments of the present invention where the decoupling capacitor is a MOS transistor, the MOS transistor is PMOS, and the decoupling capacitor is NMOS.

In some embodiments of the present invention, the MOS transistor is configured to operate in a linear region, wherein a change in the voltage applied to the gate of the MOS transistor produces a proportional change in impedance of the MOS transistor.

Embodiments of the present invention provide a system that controls noise in a power system that includes a power rail and a ground rail, wherein a first lead of a decoupling capacitor is coupled to the ground rail, a MOS transistor is coupled in series with the decoupling capacitor, with a source of the MOS transistor coupled to the power rail and a drain of the MOS transistor coupled to a second lead on the decoupling capacitor, and an inductive packaging connection is coupled to the power rail, and wherein the MOS transistor and the decoupling capacitor are configured to be in parallel with the inductive packaging connection, thereby forming a resonant circuit. The system starts by determining if there is noise in a $V_{dd}$ signal on the power rail. Then, based on the noise in the $V_{dd}$ signal, the system adjusts a voltage applied to the gate of the MOS transistor, thereby changing an impedance of the MOS transistor to reduce the noise in a frequency range near a $\omega_{interest}$ of the resonant circuit without causing an unnecessary increase in switching noise at other frequencies.

Embodiments of the present invention provide a semiconductor chip for controlling noise in a power system that includes a power rail and a ground rail. The SOC comprises: (1) a set of circuitry coupled between the power rail and the ground rail, wherein the power rail and the ground rail provide electrical power and ground for the set of circuitry; (2) a decoupling capacitor having a first lead which is coupled to the ground rail; (3) a MOS transistor coupled in series with the decoupling capacitor, wherein a source of the MOS transistor is coupled to the power rail and a drain of the MOS transistor is coupled to a second lead on the decoupling capacitor; and (4) an inductive packaging connection coupled to the power rail. The MOS transistor and the decoupling capacitor are configured to be in parallel with the inductive packaging connection, thereby forming a resonant circuit. In addition, the system includes a control circuit within an input coupled to the power rail and an output coupled to a gate of the MOS transistor. During operation, the control circuit monitors a noise in the $V_{dd}$ signal. The control circuit is configured to adjust a voltage applied to the gate of the MOS transistor based on the noise in the $V_{dd}$ signal, thereby changing an impedance of the MOS transistor to reduce the noise in a frequency range near a $\omega_{interest}$ of the resonant circuit without causing an unnecessary increase in switching noise at other frequencies.

DETAILED DESCRIPTION

Figure 1:
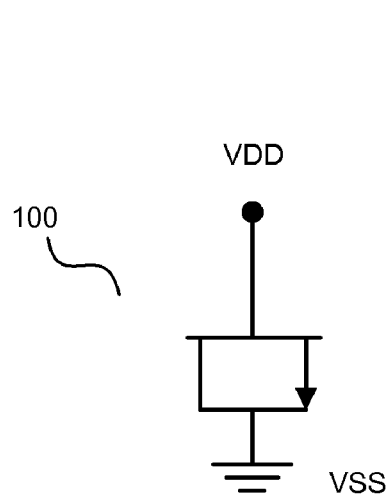
FIG. 1 presents a circuit diagram of a typical MOS decoupling capacitor.
Figure 2:
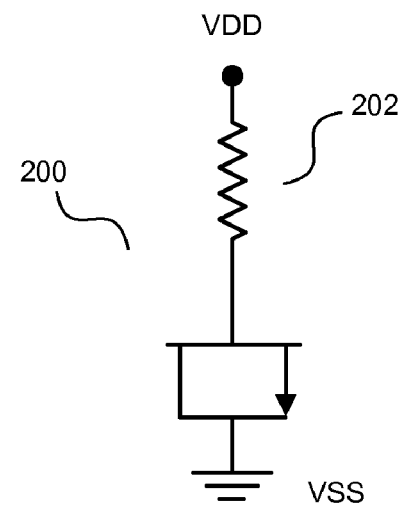
FIG. 2 presents a circuit diagram of a resistor in series with a MOS capacitor.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Overview

Embodiments of the present invention provide a variable-impedance decoupling capacitor cell that can be used to reduce power system noise in many different types of semiconductor chips, such as a "system on a chip" (SOC), a processor, an application-specific integrated circuit (ASIC), or another type of semiconductor chip that includes integrated circuits.

The variable-impedance decoupling capacitor cell includes a MOS transistor coupled in series with a decoupling capacitor, wherein the series pair is coupled between a $V_{dd}$ signal and a $V_{ss}$ signal on the semiconductor chip. By adjusting the impedance of the MOS transistor within the variable-impedance decoupling capacitor cell, these embodiments can change impedance of the resonant LC circuit formed by the decoupling capacitor in parallel with a set of inductive packaging connections, thereby reducing noise near a frequency of interest ($\omega_{interest}$) in the $V_{dd}$ signal. Note that the frequency of interest can be defined to be a frequency at which the circuit is likely to experience noise in the $V_{dd}$ signal. For example, the frequency of interest can be a resonance frequency of the circuit ($\omega_{res}$) or a frequency near the operating frequency of the circuit ($\omega_{operation}$).

In embodiments of the present invention, a control circuit that controls the impedance of the MOS transistor monitors noise in the $V_{dd}$ signal. The control circuit changes the impedance of the MOS transistor to minimize the present monitored noise in the $V_{dd}$ signal in comparison to noise detected at previous impedance adjustments of the MOS transistor.

In some embodiments of the present invention, when monitoring the noise on the $V_{dd}$ signal, the control circuit monitors noise in multiple frequency ranges in the $V_{dd}$ signal. In these embodiments, the control circuit can adjust the impedance of the MOS transistor to minimize the noise in one or more frequency ranges. For example, the control circuit can monitor noise in a range of frequencies near $\omega_{interest}$ and at another range of frequencies near $\omega_{alternate}$. Depending on the semiconductor chip and the system in which the semiconductor chip is used, the range of frequencies near $\omega_{interest}$ can include frequencies from a within a few Hz of $\omega_{interest}$ to within kHz, MHz, or GHz of $\omega_{interest}$.

In an alternative embodiment, the control circuit monitors overall noise by downconverting all noise to direct current (DC) (e.g., using a diode).

In embodiments of the present invention, the control circuit includes analog circuits. However, in alternative embodiments, some or all of the control circuit includes digital circuits.

System on a Chip

Figure 3:
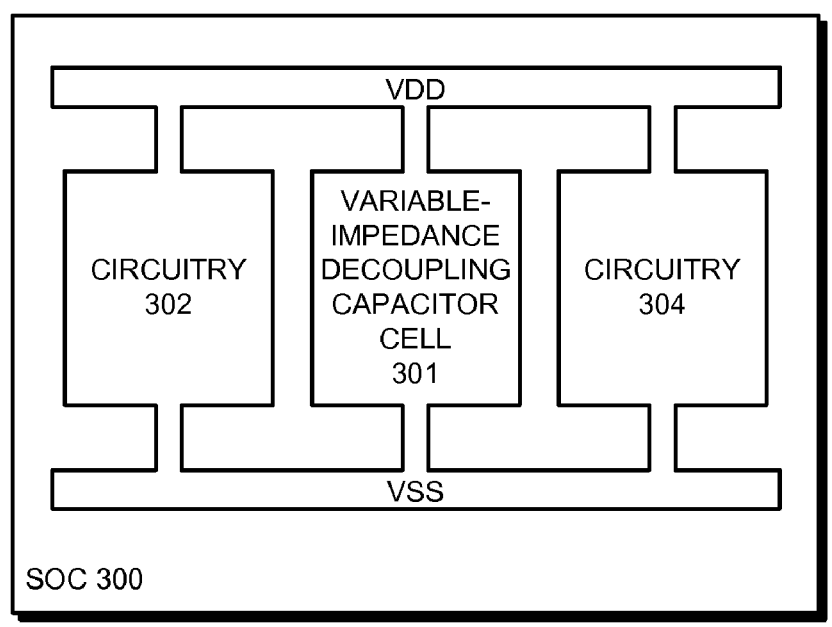
FIG. 3 presents a block diagram illustrating an exemplary system on a chip (SOC) in accordance with embodiments of the present invention.

FIG. 3 presents a block diagram illustrating an exemplary system on a chip (SOC) 300 in accordance with embodiments of the present invention. SOC 300 includes circuitry 302 and 304 and variable-impedance decoupling capacitor cell 301. SOC 300 also includes a packaging system with a power rail (i.e., the $V_{dd}$ signal) and a ground rail (i.e., the $V_{ss}$ signal) for supplying power (and ground) to circuitry 302 and 304.

Note that although we describe embodiments of the present invention in the context of SOC 300, in alternative embodiments variable-impedance decoupling capacitor cell 301 can be used with different types of semiconductor chips. For example, variable-impedance decoupling capacitor cell 301 can be used in processors, logic chips, memory chips, ASICs, analog chips, and other types of semiconductor chips. In addition, although we describe embodiments of the present invention using noise in a $V_{dd}$ signal, embodiments of the present invention can be used to reduce other forms of signal noise using the same principles.

SOCs (such as SOC 300) are generally used in electronic devices such as cell phones, personal digital assistants, embedded systems, portable computers, media players, electronic gaming systems, desktop computers, household electronics and appliances, device controllers, and other devices. Depending on the device for which SOC 300 is intended, circuitry 302 and 304 can include digital and/or analog circuits that perform different functions. For example, circuitry 302 and 304 can include controllers, processors, graphics and audio processors, transceivers, networking devices, communication circuits, memories, detectors, logic circuits, RF transmitter circuits, display drivers, global position sensor (GPS) circuits, digital signal processors, encryption circuits, analog circuits, and other circuits.

In some embodiments of the present invention, SOC 300 includes circuits such as gated power and/or clock distribution systems (not shown) that can be used to reduce power consumption. In these embodiments, when a portion of SOC 300's circuitry is not in use, SOC 300 can prevent the unused circuitry from drawing power or serving as a load on the clock distribution system. For example, SOC 300 may include a power gating circuit to block the $V_{dd}$ signal to circuitry 302.

Hence, during operation, circuitry 302 may be switched from an idle state to an active state, which can cause fluctuations in the voltage of the $V_{dd}$ signal.

Variable-impedance decoupling capacitor cell 301 is coupled between $V_{dd}$ and $V_{ss}$ to filter noise from the $V_{dd}$ signal. Internally, variable-impedance decoupling capacitor cell 301 includes a decoupling capacitor 404 (see FIG. 4) and a MOS transistor 402 in series, as well as a signal coupled from the gate connection of MOS transistor 402 to an external control circuit 406. Note that decoupling capacitor 404 can be a metal-oxide-silicon (MOS) decoupling capacitor, a metal-insulator-metal (MiM) capacitor, a varactor, or another form of decoupling capacitor.

Based on noise in the $V_{dd}$ signal, control circuit 406 adjusts a voltage value of the signal coupled to the gate connection of MOS transistor 402 to adjust the impedance of the MOS transistor 402, thereby changing the impedance of the resonant circuit. For example, control circuit 406 can increase the impedance of MOS transistor 402 to decrease the overall impedance of the resonant circuit in a range of frequencies near a frequency of interest ($\omega_{interest}$), or can decrease the impedance of MOS transistor 402 to decrease the impedance of the resonant circuit at one or more other frequencies. Note that $\omega_{interest}$ can be defined to be a frequency at which the circuit is likely to experience noise in the $V_{dd}$ signal. For example, the frequency of interest can be a resonance frequency of the circuit ($\omega_{res}$) or a frequency near the operating frequency of the circuit ($\omega_{operation}$). In addition, note that depending on the SOC and the application, the range of frequencies near $\omega_{interest}$ can include frequencies from a within a few Hz of $\omega_{res}$ to within kHz, MHz, or GHz of $\omega_{interest}$.

Although we disclose embodiments of the present invention that include one variable impedance decoupling capacitor cell 301, SOC 300 can include any number of variable-impedance decoupling capacitor cells 301. For example, SOC 300 can include hundreds or thousands of variable-impedance decoupling capacitor cells 301. In addition, one control circuit 406 can simultaneously control the MOS transistors 402 in multiple variable-impedance decoupling capacitor cells 301. In this case, each variable-impedance decoupling capacitor cell 301 includes the series pair of MOS transistor 402 and decoupling capacitor 404, but one control circuit 406 simultaneously adjusts the impedance of the MOS transistors 402 in the multiple variable-impedance decoupling capacitor cells 301.

Circuit

Figure 4:
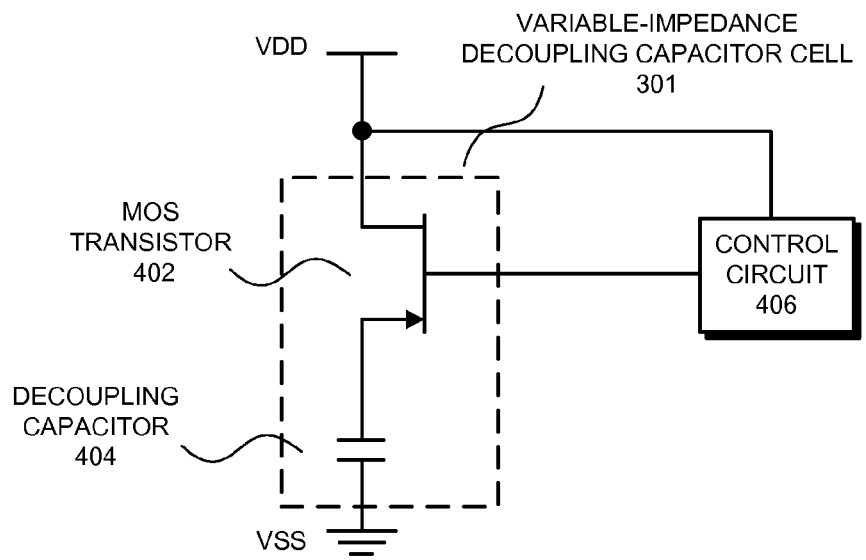
FIG. 4 presents a circuit diagram of a variable-impedance decoupling capacitor cell in accordance with embodiments of the present invention.

FIG. 4 presents a circuit diagram of a variable-impedance decoupling capacitor cell 301 in accordance with embodiments of the present invention. This variable-impedance decoupling capacitor cell 301 includes MOS transistor 402 and decoupling capacitor 404. Note that decoupling capacitor 404 can be a MOS decoupling capacitor, a MiM capacitor, a varactor, or another form of decoupling capacitor.

In embodiments of the present invention, MOS transistor 402 can be a PMOS device with a gate connection coupled to control circuit 406; a drain connection coupled to decoupling capacitor 404; and a source connection coupled to the $V_{dd}$ signal. During operation, MOS transistor 402 functions in the triode (or linear) region of the transistor's current-voltage characteristic curve. In the linear region, the impedance of MOS transistor 402 can be controlled by varying difference between the gate and source voltages. Hence, assuming that MOS transistor 402 is a PMOS device, control circuit 406 can decrease the voltage on the gate connection of MOS transistor 402 (with respect to the voltage $V_{dd}$ coupled to the source connection of MOS transistor 402) to decrease the impedance of MOS transistor 402.

Adjusting the impedance of MOS transistor 402 changes the damping constant of the resonant circuit created by the series combination of MOS transistor 402 and decoupling capacitor 404 in parallel with SOC 300's package inductance. As the damping constant increases, the impedance of the resonant circuit in the range of frequencies near $\omega_{interest}$ decreases, leading to less noise in the $V_{dd}$ signal in the range of frequencies near $\omega_{interest}$. However, as the impedance of MOS transistor 402 increases, the impedance of the resonant circuit at frequencies outside the range of frequencies near $\omega_{interest}$ also increases. This can increase the switching noise in the $V_{dd}$ signal at those frequencies. Hence, embodiments of the present invention monitor the noise in two or more frequency bands of interest and dynamically adjust the impedance of MOS transistor 402 to minimize noise in one frequency range while also controlling noise at other frequencies in the $V_{dd}$ signal. Thus, control circuit 406 can determine an impedance of MOS transistor 402 to minimize noise in one or more frequency bands of interest.

In some embodiments of the present invention where decoupling capacitor 404 is a MOS device, MOS transistor 402 is an NMOS device, while decoupling capacitor 404 is a PMOS device. In other embodiments of the present invention where decoupling capacitor 404 is a MOS device, MOS transistor 402 is a PMOS device, while decoupling capacitor 404 is an NMOS device.

Figure 5:
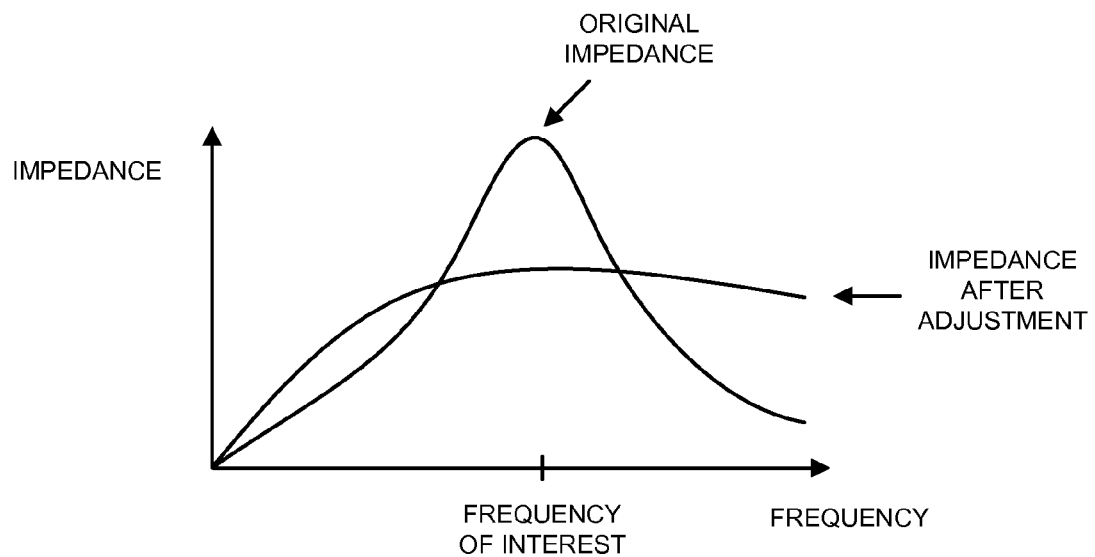
FIG. 5 presents a graph illustrating an original impedance and an adjusted impedance in accordance with embodiments of the present invention.

FIG. 5 presents a graph illustrating an original impedance and an adjusted impedance in accordance with embodiments of the present invention. As shown by the spike in the plot of "original impedance," there is initially a spike in the impedance that corresponds to a range of frequencies near $\omega_{interest}$. As described above, control circuit 406 detects a noise spike associated with the spike in impedance near $\omega_{interest}$ and makes an adjustment to the impedance of MOS transistor 402. Following the impedance adjustment, the effective impedance is lower near $\omega_{interest}$. However, the impedance at other frequencies increases with the adjustment to the impedance.

Because the amount of noise present at a given frequency is related to the impedance at that frequency, making an impedance adjustment to reduce the noise near $\omega_{interest}$ leads to an increase in the noise in the $V_{dd}$ signal for frequency ranges outside the frequency range near $\omega_{interest}$. Consequently, some embodiments of the present invention monitor the noise in more than one frequency range and balance the reduction of the noise in the frequency range near $\omega_{interest}$ against the increase of noise in one or more other frequency ranges.

Control Circuit

Figure 6:
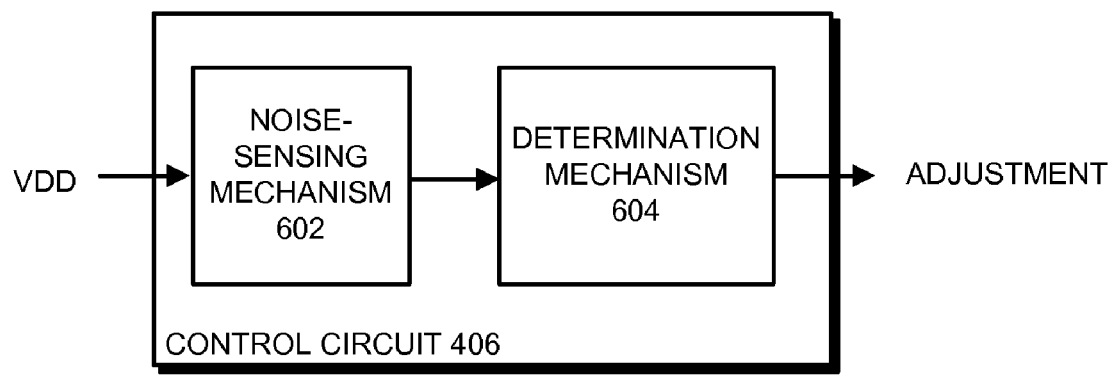
FIG. 6 presents a block diagram of a control circuit in accordance with embodiments of the present invention.

FIG. 6 presents a block diagram of control circuit 406 in accordance with embodiments of the present invention. Control circuit 406 includes noise-sensing mechanism 602 and determination mechanism 604. Generally, control circuit 406 takes the $V_{dd}$ signal as an input and outputs an adjustment signal to control the impedance of MOS transistor 402.

Control circuit 406 functions in the following way. First, the $V_{dd}$ signal is input into noise-sensing mechanism 602. In some embodiments of the present invention, noise-sensing mechanism 602 includes one or more filtering mechanisms to filter one or more frequency ranges from the $V_{dd}$ signal. For example, noise-sensing mechanism can include a low-pass filter and/or a band-pass filter that passes frequencies near $\omega_{interest}$. In alternative embodiments of the present invention, noise-sensing mechanism 602 includes a peak-detection mechanism that detects peaks in the $V_{dd}$ signal. In other alternative embodiments of the present invention, noise-sensing mechanism 602 includes a down-conversion mechanism (e.g., a diode) that down-converts the noise signal to DC.

For the sake of clarity, in the following paragraphs we describe embodiments of the present invention where noise-sensing mechanism 602 uses a filtering mechanism to provide determination mechanism 604 with a low-pass filtered signal and a band-pass filtered signal (for a range of frequencies near $\omega_{interest}$) from the $V_{dd}$ signal. However, the other embodiments described above function in substantially the same way (i.e., these embodiments determine noise in the $V_{dd}$ signal and adjust the impedance of variable-impedance decoupling capacitor cell 301 accordingly).

Noise-sensing mechanism 602 passes a low-pass signal and a band-pass signal for a range of frequencies near $\omega_{interest}$ filtered from the $V_{dd}$ signal to determination mechanism 604. Within determination mechanism 604, a controller compares a present value of the low-passed signal to the band-passed signal to determine the difference between the signals. Based on the difference, determination mechanism 604 can change the adjustment signal to increase or decrease the impedance of MOS transistor 402 (see FIG. 4). For example, determination mechanism 604 can increase the impedance of MOS transistor 402 to decrease the overall impedance of the resonant circuit in a range of frequencies near $\omega_{interest}$, or can decrease the impedance of MOS transistor 402 to decrease the impedance of the resonant circuit at the low frequencies (and other frequencies outside the range of frequencies near $\omega_{interest}$). Note that $\omega_{interest}$ can be defined to be a frequency at which the circuit is likely to experience noise in the $V_{dd}$ signal. For example, the frequency of interest can be a resonance frequency of the circuit ($\omega_{res}$) or a frequency near the operating frequency of the circuit ($\omega_{operation}$). In addition, note that depending on the SOC and the application, the range of frequencies near $\omega_{interest}$ can include frequencies from a within a few Hz of $\omega_{interest}$ to within kHz, MHz, or GHz of $\omega_{interest}$.

In some embodiments of the present invention, noise-sensing mechanism 602 outputs a present amplitude of the noise in the $V_{dd}$ signal in a predetermined frequency range near $\omega_{interest}$ and a present amplitude of the noise at least one other frequency range of the $V_{dd}$ signal. In these embodiments, determination mechanism 604 determines the voltage to apply to the gate of the MOS transistor by comparing the present amplitude of the noise in the $V_{dd}$ signal in the predetermined frequency range near $\omega_{interest}$ to at least one previous amplitude of the noise in the $V_{dd}$ signal in the predetermined frequency range near $\omega_{interest}$ and by comparing the present amplitude of the noise in at least one other frequency range of the $V_{dd}$ signal to at least one previous amplitude of the noise in at least one other frequency range of the $V_{dd}$ signal.

In some embodiments of the present invention, determination mechanism 604 keeps a record of a predetermined number of previous impedance adjustments and their associated noise values. When determining whether to change the adjustment signal (i.e., adjust the impedance of MOS transistor 402), determination mechanism 604 compares the present impedance and noise values to one or more prior impedance and noise values. Using the prior values, determination mechanism 604 can iteratively make adjustments to the impedance until the noise near $\omega_{interest}$ and the low-frequency noise are balanced (i.e., each of the noise signals is adjusted with respect to the effect on the other noise signal).

In some embodiments of the present invention, determination mechanism 604 is an operational amplifier (op amp) that outputs a signal reflecting the magnitude of the difference between the band-passed signal and the low-passed signal.

In some embodiments of the present invention, determination mechanism 604 does not make the noise-level determinations continuously. Instead, the determination (and therefore the adjustment to the impedance of MOS transistor 402) occurs based on some predetermined event. For example, determination mechanism 604 may make the comparison automatically on a periodic basis (i.e., every millisecond, second, minute, etc.). On the other hand, determination mechanism 604 may not make the comparison until one or more conditions is true about the $V_{dd}$ signal. For example, determination mechanism 604 may make the comparison when the noise in the $V_{dd}$ signal has reached a new peak relative to prior noise peak values.

MOS Transistor Impedance Adjustment Plot

Figure 7:
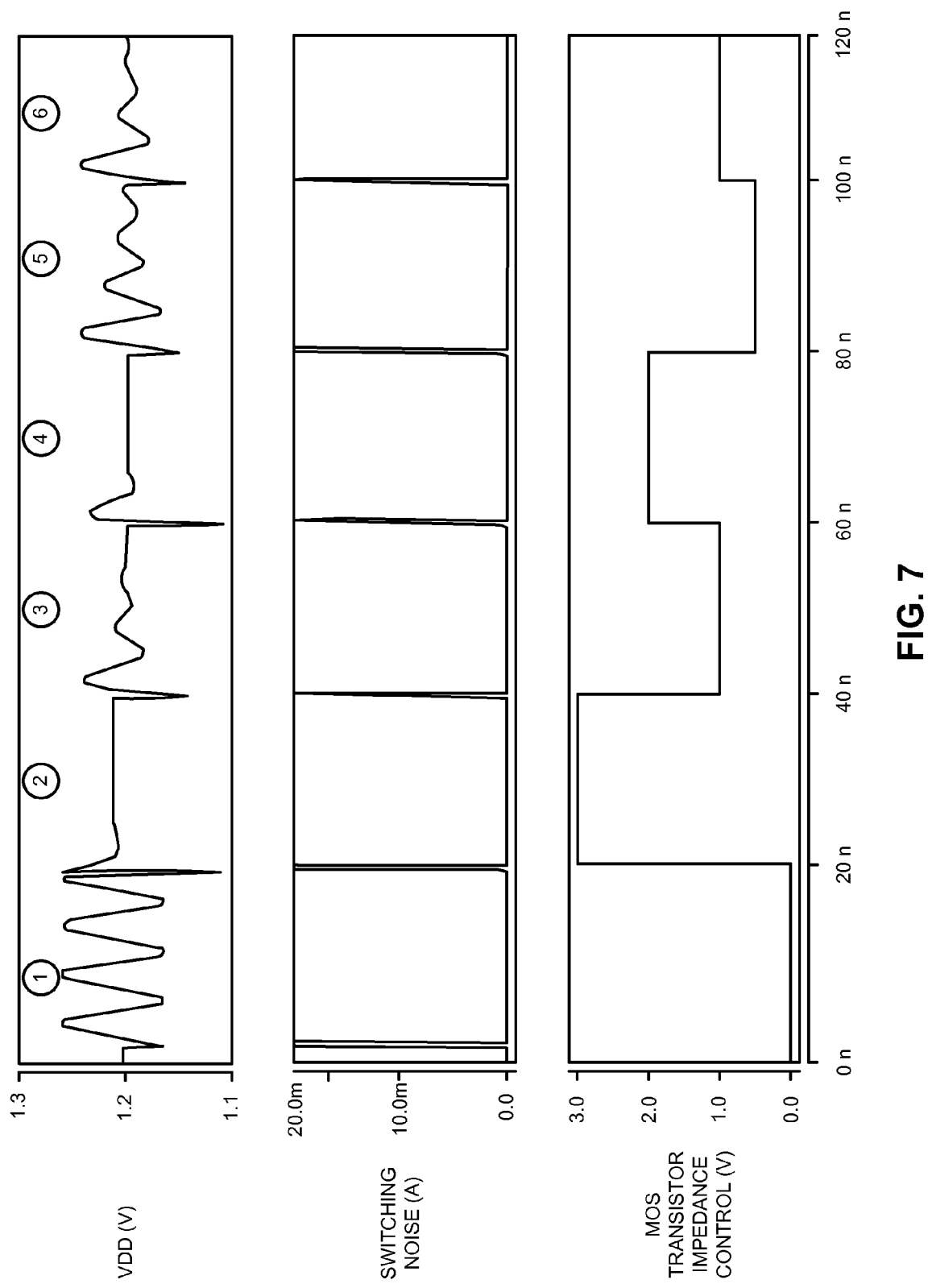
FIG. 7 presents a graph illustrating the effect of a series of MOS transistor impedance adjustments in a variable-impedance decoupling capacitor cell coupled to a $V_{dd}$ signal in accordance with embodiments of the present invention.

FIG. 7 presents a graph illustrating the effect of a series of MOS transistor impedance adjustments in a variable-impedance decoupling capacitor cell 301 coupled to a $V_{dd}$ signal in accordance with embodiments of the present invention. Note that we describe only one variable-impedance decoupling capacitor cell 301 for the purposes of illustration, but two or more variable-impedance decoupling capacitor cells 301 can be coupled to the $V_{dd}$ signal to filter noise using the same principles.

In FIG. 7, the top plot is the $V_{dd}$ signal, the middle plot is exemplary switching noise in SOC 300, and the bottom plot is the MOS transistor impedance control signal. FIG. 7 includes a series of "switch events," or noise pulses, which affect the $V_{dd}$ signal (e.g., from a large load being applied to the power rail, which can cause the $V_{dd}$ signal to oscillate). Each switch event is marked numerically in the top plot (1, 2, etc.).

At time zero, the MOS transistor impedance control signal is set to 0 V, resulting in very low impedance across MOS transistor 402. Consequently, the parallel combination of the inductive packaging connections to SOC 300 and the decoupling capacitors 404 creates a resonant LC circuit whose impedance is high in a range of frequencies near $\omega_{interest}$ (in this example, $\omega_{interest}$ is $\omega_{res}$). When the first switch event occurs (a first noise pulse on the $V_{dd}$ signal), a small amount of switching noise is encountered outside the range of frequencies near $\omega_{interest}$, but significant "ringing" noise at $\omega_{interest}$ (shown as a sine wave) is seen on the $V_{dd}$ signal (see switching event 1).

Note that the switching noise pulse initially contains many frequencies of noise, one of which is in a frequency range near $\omega_{interest}$. However, the other frequencies are filtered by the decoupling capacitor cell, leaving the noise near $\omega_{interest}$ on the $V_{dd}$ signal.

Control circuit 406 determines that the noise near $\omega_{interest}$ is large while the switching noise is small during the first switching event. In response, at time 20 nS control circuit 406 increases the control signal to MOS transistor 402 to 3 V, as shown in the lower plot. At 3 V, the impedance of MOS transistor 402 is considerably higher than the prior setting.

As the top plot shows, when switching event 2 occurs, because of the increased impedance of MOS transistor 402, the $V_{dd}$ signal is far less affected by ringing noise at $\omega_{interest}$. However, the increased impedance leads to a large switching noise spike in the $V_{dd}$ signal.

Because the noise near $\omega_{interest}$ is small while the switching noise is significant, at time 40 nS control circuit 406 reduces the control signal to MOS transistor 402 to 1 V, as shown in the lower plot. At 1 V, the impedance of MOS transistor 402 is lower than the prior setting.

When switching event 3 occurs, because of the decreased impedance of MOS transistor 402, the $V_{dd}$ signal is more affected by ringing noise at $\omega_{interest}$. However, the switching noise spike is noticeably reduced.

Because the noise near $\omega_{interest}$ is larger while the switching noise is smaller, at time 60 nS control circuit 406 increases the control signal to MOS transistor 402 to 2 V, as shown in the lower plot. At 2 V, the impedance of MOS transistor 402 is increased.

When switching event 4 occurs, because of the increased impedance of MOS transistor 402, the $V_{dd}$ signal is less affected by ringing noise at $\omega_{interest}$. However, the switching noise spike increases.

During switching events 5 and 6, control circuit 406 continues to adjust the impedance of MOS transistor 402.

After a number of such adjustments, control circuit 406 makes a determination which value of impedance to use. When making the determination, control circuit 406 uses one or more predetermined criteria. For example, if the noise near $\omega_{interest}$ is the only consideration, the setting used during switching event 2 (3 V) might be chosen for the control signal, resulting in a significant impedance for MOS transistor 402. If a tradeoff between noise near $\omega_{interest}$ and switching noise is desired, the setting used during switching event 3 or 6 (1 V) might be chosen.

Process

Figure 8:
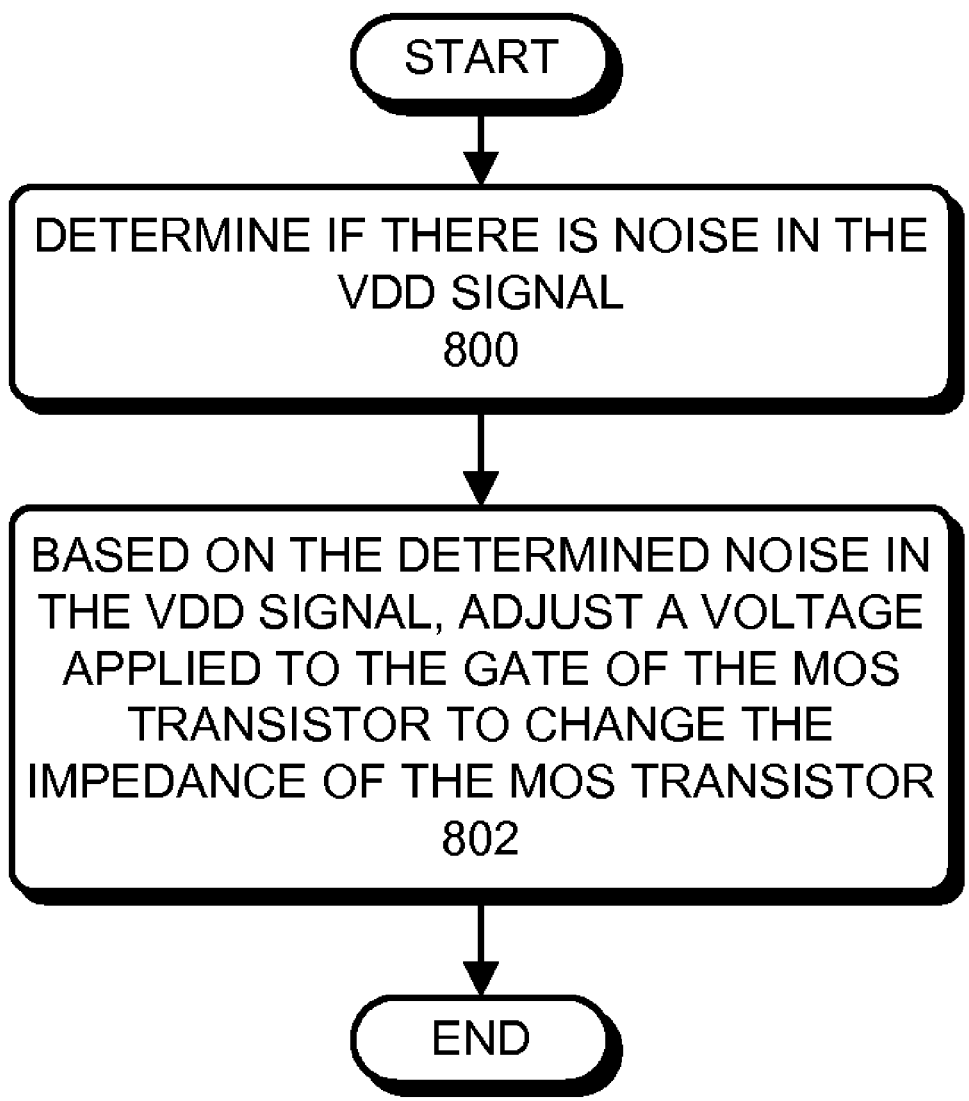
FIG. 8 presents a flowchart illustrating the process of controlling noise in a $V_{dd}$ signal in accordance with embodiments of the present invention.

FIG. 8 presents a flowchart illustrating the process of controlling noise in a $V_{dd}$ signal in accordance with embodiments of the present invention.

The process starts when the system determines if there is noise in the $V_{dd}$ signal (step 800). When making this determination, some embodiments of the present invention compare a amplitude of a first frequency range of the $V_{dd}$ signal with a amplitude of a second frequency range of the $V_{dd}$ signal and determine how a present noise in the $V_{dd}$ signal compares to a previous value of noise. Other embodiments down-convert the overall noise signal to a DC value (e.g., using a diode) and monitor the DC value in comparison to prior DC values. Yet other embodiments peak-detect the $V_{dd}$ signal to detect noise.

Based on the determined noise in the $V_{dd}$ signal, the system adjusts a voltage applied to the gate of MOS transistor 402 (see FIG. 4) to change the impedance of MOS transistor 402 (step 802). For example, control circuit 406 can increase the impedance of MOS transistor 402 to decrease the overall impedance of the resonant circuit in a range of frequencies near $\omega_{interest}$, or can decrease the impedance of MOS transistor 402 to decrease the impedance of the resonant circuit at one or more other frequencies.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus for controlling noise in a power system that includes a power rail and a ground rail, comprising:
   a decoupling capacitor having a first lead which is coupled to the ground rail;
   a MOS transistor coupled to the decoupling capacitor, wherein a source of the MOS transistor is coupled to the power rail and a drain of the MOS transistor is coupled to a second lead on the decoupling capacitor;
   an inductive packaging connection coupled to the power rail, wherein the MOS transistor and the decoupling capacitor are configured to be in parallel with the inductive packaging connection, thereby forming a resonant circuit; and a control circuit with an input coupled to the power rail and an output coupled to a gate of the MOS transistor, wherein the control circuit adjusts a voltage applied to the gate of the MOS transistor, thereby changing an impedance of the MOS transistor to reduce a noise in a frequency range near a frequency of interest ($\omega_{interest}$) of the resonant circuit without causing an unnecessary increase in switching noise at other frequencies, the control circuit comprising;

a noise-sensing mechanism configured to monitor the $V_{dd}$ signal and output a present amplitude of the noise in the $V_{dd}$ signal in a predetermined frequency range near $\omega_{interest}$ and a present amplitude of the noise at least one other frequency range of the $V_{dd}$ signal; and a determination mechanism configured to determine the voltage applied to the gate of the MOS transistor by comparing the present amplitude of the noise in the $V_{dd}$ signal in the predetermined frequency range near $\omega_{interest}$ to at least one previous amplitude of the noise in the $V_{dd}$ signal in the predetermined frequency range near $\omega_{interest}$ and by comparing the present amplitude of the noise in at least one other frequency range of the $V_{dd}$ signal to at least one previous amplitude of the noise in at least one other frequency range of the $V_{dd}$ signal.

2. The apparatus of claim 1, wherein when outputting the present amplitude of the noise in the $V_{dd}$ signal in a given frequency range, the noise-sensing mechanism is configured to sample the noise in the $V_{dd}$ signal two or more times and compute a value for the present amplitude that represents the two or more samples of the noise in the $V_{dd}$ signal.

3. The apparatus of claim 1, wherein the noise-sensing mechanism is configured to down-convert the $V_{dd}$ signal to a DC signal and output the DC signal; and wherein the determination mechanism is configured to determine the voltage to apply to the gate of the MOS transistor by comparing a present value of the DC signal to at least one previous value of the DC signal.

4. The apparatus of claim 1, wherein the noise-sensing mechanism is configured to detect a present peak in an amplitude of at least one frequency range of the $V_{dd}$ signal and output the present peak; and wherein the determination mechanism is configured to determine the voltage to apply to the gate of the MOS transistor by comparing the present peak to a previous peak in the amplitude of the at least one frequency range of the $V_{dd}$ signal.

5. The apparatus of claim 1, wherein the control circuit is configured to:

increase the impedance of the MOS transistor to decrease the noise in the frequency range near $\omega_{interest}$; or decrease the impedance of the MOS transistor to decrease the switching noise at other frequencies.

6. The apparatus of claim 1, wherein the decoupling capacitor is a metal-oxide-silicon (MOS) capacitor, a metal-insulator-metal (MIM) capacitor, or a varactor.

7. The apparatus of claim 6, wherein if the decoupling capacitor is a MOS capacitor, the MOS transistor is NMOS and the decoupling capacitor is PMOS or the MOS transistor is PMOS, and the decoupling capacitor is NMOS.

8. The apparatus of claim 1, wherein the MOS transistor is configured to operate in a linear region, wherein a change in the voltage applied to the gate of the MOS transistor produces a proportional change in impedance of the MOS transistor.

9. The apparatus of claim 1, wherein $\omega_{interest}$ is one of a resonant frequency or a frequency of operation.

10. A semiconductor chip for controlling noise in a power system that includes a power rail and a ground rail, comprising:

a set of circuitry coupled between the power rail and the ground rail, wherein the power rail and the ground rail provide electrical power for the set of circuitry;

a decoupling capacitor having a first lead which is coupled to the ground rail;

a MOS transistor coupled to the decoupling capacitor, wherein a source of the MOS transistor is coupled to the power rail and a drain of the MOS transistor is coupled to a second lead on the decoupling capacitor;

an inductive packaging connection coupled to the power rail, wherein the MOS transistor and the decoupling capacitor are configured to be in parallel with the inductive packaging connection, thereby forming a resonant circuit; and a control circuit with an input coupled to the power rail and an output coupled to a gate of the MOS transistor, wherein the control circuit adjusts a voltage applied to the gate of the MOS transistor, thereby changing an impedance of the MOS transistor to reduce a noise in a frequency range near a frequency of interest ($\omega_{interest}$) of the resonant circuit without causing an unnecessary increase in switching noise at other frequencies, the control circuit comprising:

a noise-sensing mechanism configured to monitor the $V_{dd}$ signal and output a present amplitude of the noise in the $V_{dd}$ signal in a predetermined frequency range near $\omega_{interest}$ and a present amplitude of the noise at least one other frequency range of the $V_{dd}$ signal; and a determination mechanism configured to determine the voltage applied to the gate of the MOS transistor by comparing the present amplitude of the noise in the $V_{dd}$ signal in the predetermined frequency ran e near $\omega_{interest}$ to at least one previous amplitude of the noise in the $V_{dd}$ signal in the predetermined frequency range near $\omega_{interest}$ and by comparing the present amplitude of the noise in at least one other frequency range of the $V_{dd}$ signal to at least one previous amplitude of the noise in at least one other frequency range of the $V_{dd}$ signal.

11. The semiconductor chip of claim 10, wherein when outputting the present amplitude of the noise in the $V_{dd}$ signal in a given frequency range, the noise-sensing mechanism is configured to sample the noise in the $V_{dd}$ signal two or more times, and compute a value that represents the two or more samples of the noise in the $V_{dd}$ signal.

12. The semiconductor chip of claim 10, wherein the noise-sensing mechanism is configured to down-convert the $V_{dd}$ signal to a DC signal and output the DC signal; and wherein the determination mechanism is configured to determine the voltage to apply to the gate of the MOS transistor by comparing a present value of the DC signal to at least one previous value of the DC signal.

13. The semiconductor chip of claim 10, wherein the noise-sensing mechanism is configured to detect a present peak in an amplitude of at least one frequency range of the $V_{dd}$ signal and output the present peak; and wherein the determination mechanism is configured to determine the voltage to apply to the gate of the MOS transistor by comparing the present peak to a previous peak in the amplitude of the at least one frequency range of the $V_{dd}$ signal.

14. The semiconductor chip of claim 10, wherein the control circuit is configured to:
increase the impedance of the MOS transistor to decrease the noise in the frequency range near $\omega_{interest}$; or
decrease the impedance of the MOS transistor to decrease the switching noise at other frequencies.

15. The semiconductor chip of claim 10, wherein the decoupling capacitor is a metal-oxide-silicon (MOS) capacitor, a metal-insulator-metal (MIM) capacitor, or a varactor.

16. The semiconductor chip of claim 15, wherein if the decoupling capacitor is a MOS capacitor, the MOS transistor is NMOS and the decoupling capacitor is PMOS or the MOS transistor is PMOS, and the decoupling capacitor is NMOS.

17. The semiconductor chip of claim 10, wherein the MOS transistor is configured to operate in a linear region, wherein a change in the voltage applied to the gate of the MOS transistor produces a proportional change in impedance of the MOS transistor.

18. The semiconductor chip of claim 10, wherein $\omega_{interest}$ is one of a resonant frequency or a frequency of operation.

19. A method for controlling noise in a power system that includes a power rail coupled to an inductive packaging connection, a ground rail, a MOS transistor, and a decoupling capacitor, wherein a source of the MOS transistor is coupled to the power rail and a drain of the MOS transistor is coupled to the ground rail through the decoupling capacitor, and wherein the MOS transistor and the decoupling capacitor are in parallel with the inductive packaging connection, thereby forming a resonant circuit, the method comprising:
detecting noise in a $V_{dd}$ signal on the power rail by:
comparing a present amplitude of the noise in the $V_{dd}$ signal in a predetermined frequency range near a frequency of interest ($\omega_{interest}$) of the resonant circuit to at least one previous amplitude of the noise in the $V_{dd}$ signal in the predetermined frequency range near $\omega_{interest}$; and
comparing a present amplitude at least one other frequency range of the noise in the $V_{dd}$ signal to at least one previous amplitude at least one other frequency range of the noise in the $V_{dd}$ signal; and
based on the detected noise in the $V_{dd}$ signal, adjusting a voltage applied to the gate of the MOS transistor, thereby changing an impedance of the MOS transistor to reduce the noise in the frequency range near $\omega_{interest}$ without causing an unnecessary increase in switching noise at other frequencies.

20. The method of claim 19, wherein comparing the present amplitude of the noise in the $V_{dd}$ signal in a given frequency range involves sampling the noise in the $V_{dd}$ signal in the frequency range two or more times and computing a value that represents the two or more samples of the noise in the $V_{dd}$ signal in the frequency range.

21. The method of claim 19, wherein detecting noise in the $V_{dd}$ signal involves:
down-converting the $V_{dd}$ signal to a DC signal; and
comparing a present value of the DC signal to at least one previous value of the DC signal.

22. The method of claim 19, wherein detecting noise in the $V_{dd}$ signal involves:
detecting a present peak in an amplitude of at least one frequency range of the $V_{dd}$ signal; and
comparing the present peak to a previous peak in the amplitude of the at least one frequency range of the $V_{dd}$ signal.

23. The method of claim 19, wherein changing the impedance of the MOS transistor involves:
increasing the impedance of the MOS transistor to decrease the noise in the frequency range near $\omega_{interest}$; or
decreasing the impedance of the MOS transistor to decrease the switching noise at other frequencies.

24. The method of claim 19, wherein the method further comprises operating the MOS transistor in a linear region, wherein a change in the voltage applied to the gate of the MOS transistor produces a proportional change in impedance of the MOS transistor.

25. The method of claim 19, wherein $\omega_{interest}$ is one of a resonant frequency or a frequency of operation.

* * * * *